(12) United States Patent
Lu

(10) Patent No.: US 11,765,853 B2
(45) Date of Patent: Sep. 19, 2023

(54) SERVER RACK

(71) Applicants: Inventec (Pudong) Technology Corporation, Shanghai (CN); INVENTEC CORPORATION, Taipei (TW)

(72) Inventor: Xiaogang Lu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 256 days.

(21) Appl. No.: 17/346,689

(22) Filed: Jun. 14, 2021

(65) Prior Publication Data

US 2022/0287199 A1 Sep. 8, 2022

(30) Foreign Application Priority Data

Mar. 2, 2021 (CN) .......................... 202110231857.4

(51) Int. Cl.
*H05K 7/18* (2006.01)
*H05K 7/14* (2006.01)

(52) U.S. Cl.
CPC ............ *H05K 7/18* (2013.01); *H05K 7/1489* (2013.01); *H05K 7/1491* (2013.01)

(58) Field of Classification Search
CPC ...... H05K 7/18; H05K 7/1489; H05K 7/1491; H05K 7/183; H05K 7/20; H05K 7/20145
See application file for complete search history.

(56) References Cited

U.S. PATENT DOCUMENTS

| 6,719,149 | B2 * | 4/2004 | Tomino | H04Q 1/035 439/456 |
| 7,508,660 | B2 * | 3/2009 | Lin | H05K 7/1412 361/679.4 |
| 7,780,254 | B2 * | 8/2010 | Wang | A47B 88/483 312/334.44 |
| 8,226,181 | B2 * | 7/2012 | Du | H05K 7/1489 312/334.4 |
| 8,287,059 | B2 * | 10/2012 | Yang | H05K 7/1489 312/334.44 |
| 8,371,542 | B2 * | 2/2013 | Zhang | H05K 7/183 248/220.21 |

(Continued)

FOREIGN PATENT DOCUMENTS

| RU | 2763157 C2 * | 12/2021 | ............. G06F 1/181 |
| TW | 201703031 A * | 1/2017 | ............. A47B 88/43 |
| TW | I711359 B * | 11/2020 | ............. G06F 1/181 |

*Primary Examiner* — Patrick D Hawn
(74) *Attorney, Agent, or Firm* — Locke Lord LLP; Tim Tingkang Xia, Esq.

(57) ABSTRACT

A server rack is configured to accommodate a network switch. The server rack includes a rack body, at least one stretchable frame, and at least one baffle. The rack body has two first strips opposite to each other. The stretchable frame includes a guiding part and an adjustable part slidably disposed on the guiding part. The guiding part and the adjustable part of the stretchable frame are respectively mounted on the two first strips. The baffle is connected to the guiding part. The baffle is located between the two first strips, and the baffle is configured to be located at a side of the network switch to guide an airflow to the network switch.

8 Claims, 7 Drawing Sheets

(56) References Cited

U.S. PATENT DOCUMENTS

| | | | | |
|---|---|---|---|---|
| 8,474,924 B2* | 7/2013 | Hsu | ............... | H05K 7/1489 |
| | | | | 312/334.8 |
| 9,648,771 B1* | 5/2017 | Markowski | ......... | H05K 7/1401 |
| 10,111,354 B2* | 10/2018 | Hu | ................... | H05K 7/14 |
| 11,116,104 B2* | 9/2021 | Shen | ............. | A47B 96/021 |
| 11,547,013 B2* | 1/2023 | Shen | ............. | A47B 96/021 |
| 2003/0161114 A1* | 8/2003 | Berry | ............ | H05K 7/1489 |
| | | | | 361/740 |
| 2003/0193781 A1* | 10/2003 | Mori | ............. | H05K 7/1489 |
| | | | | 361/725 |
| 2008/0217497 A1* | 9/2008 | Yang | ............ | H05K 7/1489 |
| | | | | 248/298.1 |
| 2020/0187378 A1* | 6/2020 | Shen | ............. | A47B 96/021 |
| 2021/0400834 A1* | 12/2021 | Shen | ............. | H05K 7/1489 |

* cited by examiner

SERVER RACK

CROSS-REFERENCE TO RELATED APPLICATIONS

This non-provisional application claims priority under 35 U.S.C. § 119(a) on Patent Application No(s). 202110231857.4 filed in China on Mar. 2, 2021, the entire contents of which are hereby incorporated by reference.

TECHNICAL FIELD OF THE INVENTION

The invention relates to a server rack, more particularly to a server rack including a stretchable frame and a baffle.

DESCRIPTION OF THE RELATED ART

As technology develops and progresses, a server is widely used in various fields. In general, the server is cooperated with a network switch, and the server and the network switch are accommodated in a server rack.

However, there are rooms formed between two opposite sides of the network switch and two opposite walls of the server rack, which makes cold air directly flow into the rooms rather than directly flow towards the network switch, thereby reducing the heat dissipation efficiency of the cold air. On the other hand, hot air generated by the network switch may flow through such rooms so as to converge with the cold air, adversely affecting the heat dissipation efficiency of the cold air. Therefore, how to solve the aforementioned problems is one of crucial topics in this field.

SUMMARY OF THE INVENTION

The invention is to provide a server rack that prevents the cold air from losing and avoiding the cold air from converging with the hot air generated by the network switch.

One embodiment of the invention provides a server rack. The server rack is configured to accommodate a network switch. The server rack includes a rack body, at least one stretchable frame, and at least one baffle. The rack body has two first strips opposite to each other. The stretchable frame includes a guiding part and an adjustable part slidably disposed on the guiding part. The guiding part and the adjustable part of the stretchable frame are respectively mounted on the two first strips. The baffle is connected to the guiding part. The baffle is located between the two first strips, and the baffle is configured to be located at a side of the network switch to guide an airflow to the network switch.

According to the server rack discussed in the above embodiment, the guiding part and the adjustable part of the stretchable frame are respectively mounted on the two first strips of the rack body, and the baffle is located between the two first strips and located at a side of the network switch. Therefore, the baffle can separate hot air generated by the network switch from cold air used to cool the network switch and guide the cold air to the network switch, thereby effectively using the cold air to cool the network switch.

BRIEF DESCRIPTION OF THE DRAWINGS

The present invention will become better understood from the detailed description given herein below and the accompanying drawings which are given by way of illustration only and thus are not intending to limit the present invention and wherein.

DETAILED DESCRIPTION

Figure 1:
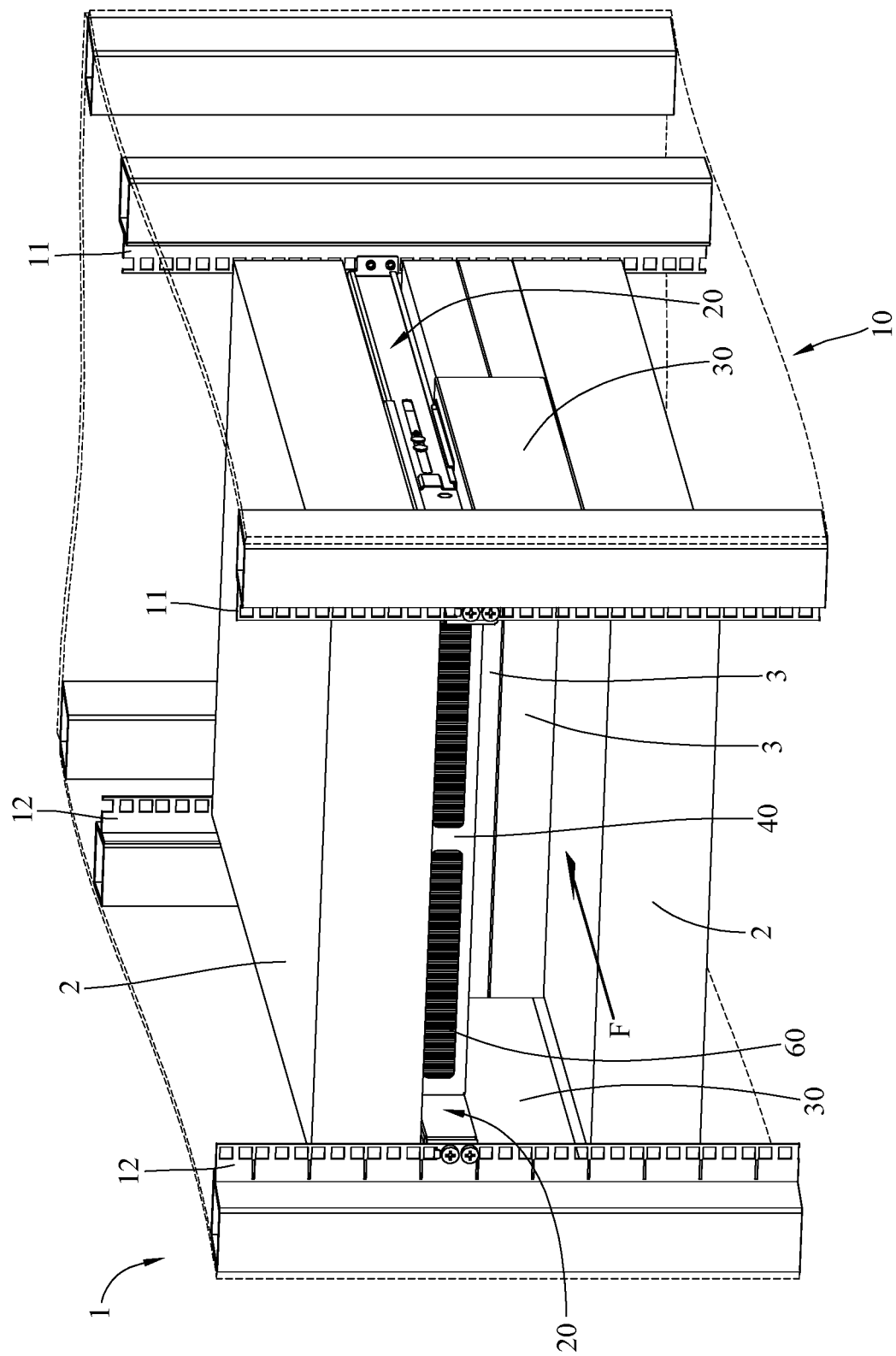
FIG. 1 is a perspective view of a server rack according to one embodiment of the invention with servers and network switches disposed therein.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the following embodiments are disclosed by the figures, and some practical details are described in the following paragraphs, but the present invention is not limited thereto. Furthermore, for the purpose of illustration, some of the structures and components in the figures are simplified, and wires, reference lines or buses are omitted in some of the figures.

Moreover, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
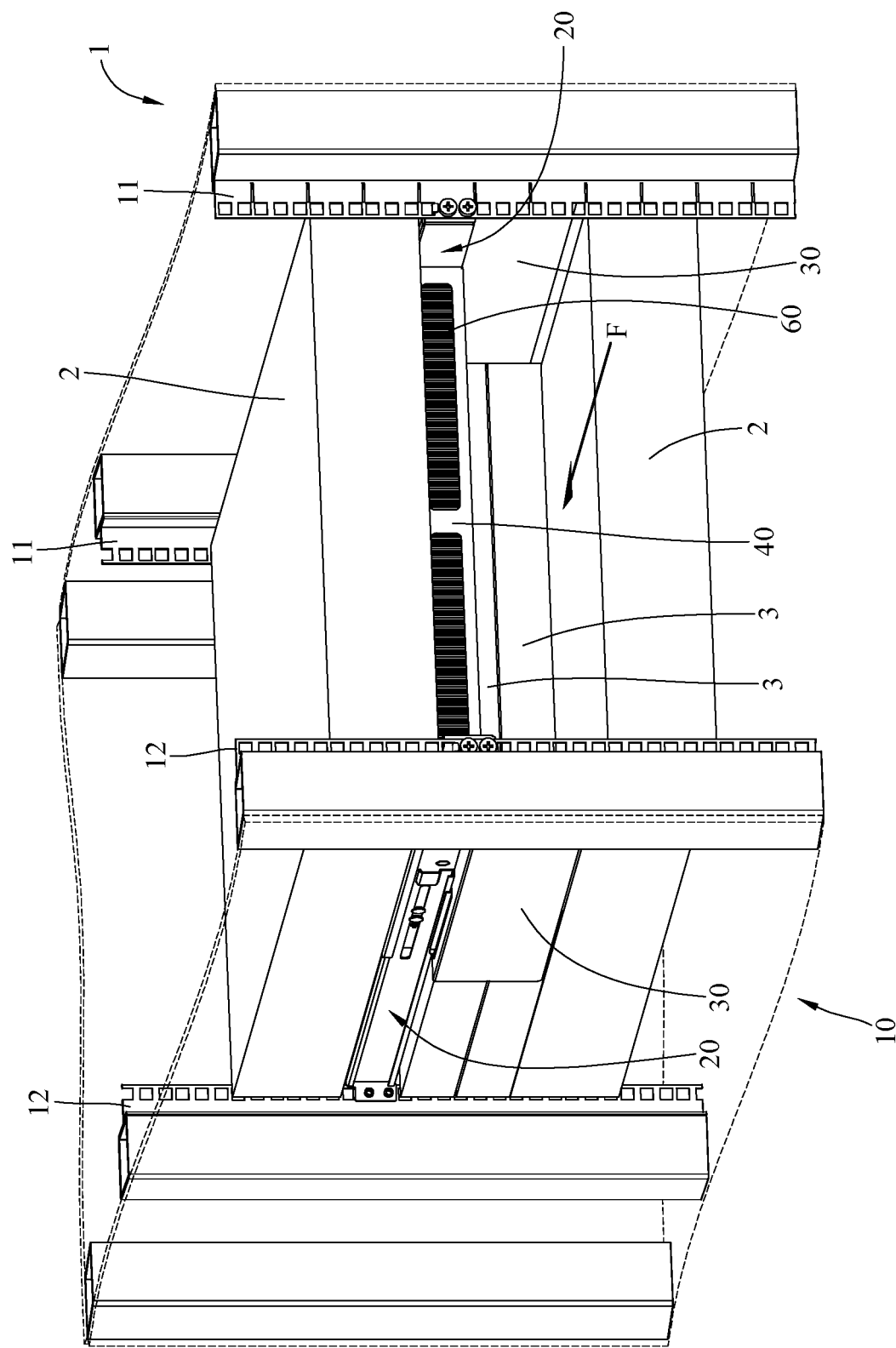
FIG. 2 is another perspective view of the server rack, the servers and the network switches in FIG. 1.

Referring to FIGS. 1 and 2, there are shown a perspective view of a server rack 1 according to one embodiment of the invention with servers 2 and network switches 3 and another perspective view of the server rack 1 with the servers 2 and the network switches 3 in FIG. 1.

In this embodiment, the server rack 1 is configured to accommodate the servers 2 and the network switches 3. The server rack 1 includes a rack body 10, two stretchable frames 20 and two baffles 30.

The rack body 10 has two first strips 11 and two second strips 12. The first strips 11 are opposite to each other, and the second strips 12 are opposite to each other. The first strips 11 and the second strips 12 are respectively located at two opposite sides of the rack body 10.

Figure 3:
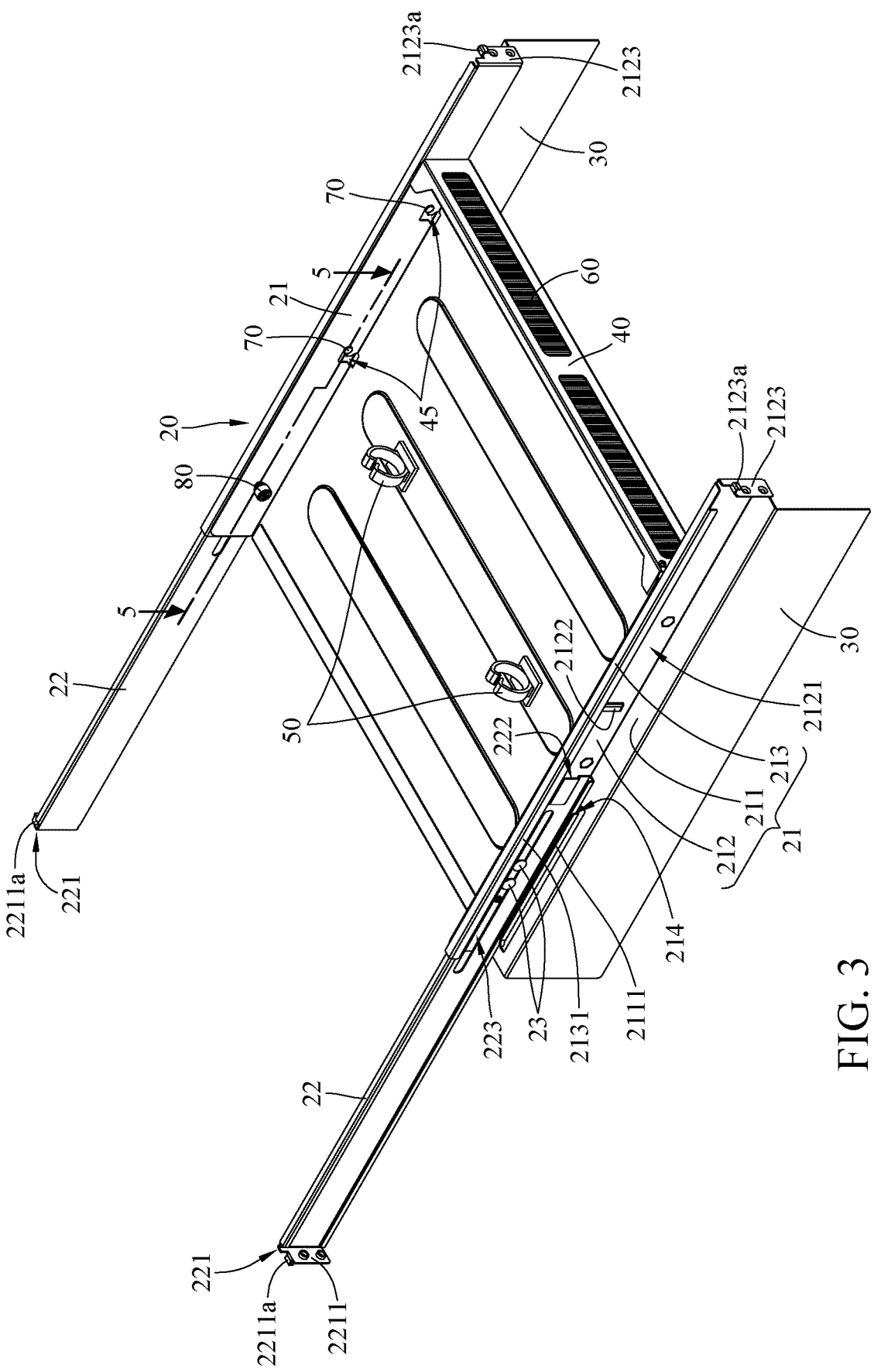
FIG. 3 is a perspective view of stretchable frames, baffles, and a tray of the server rack in FIG. 1.
Figure 4:
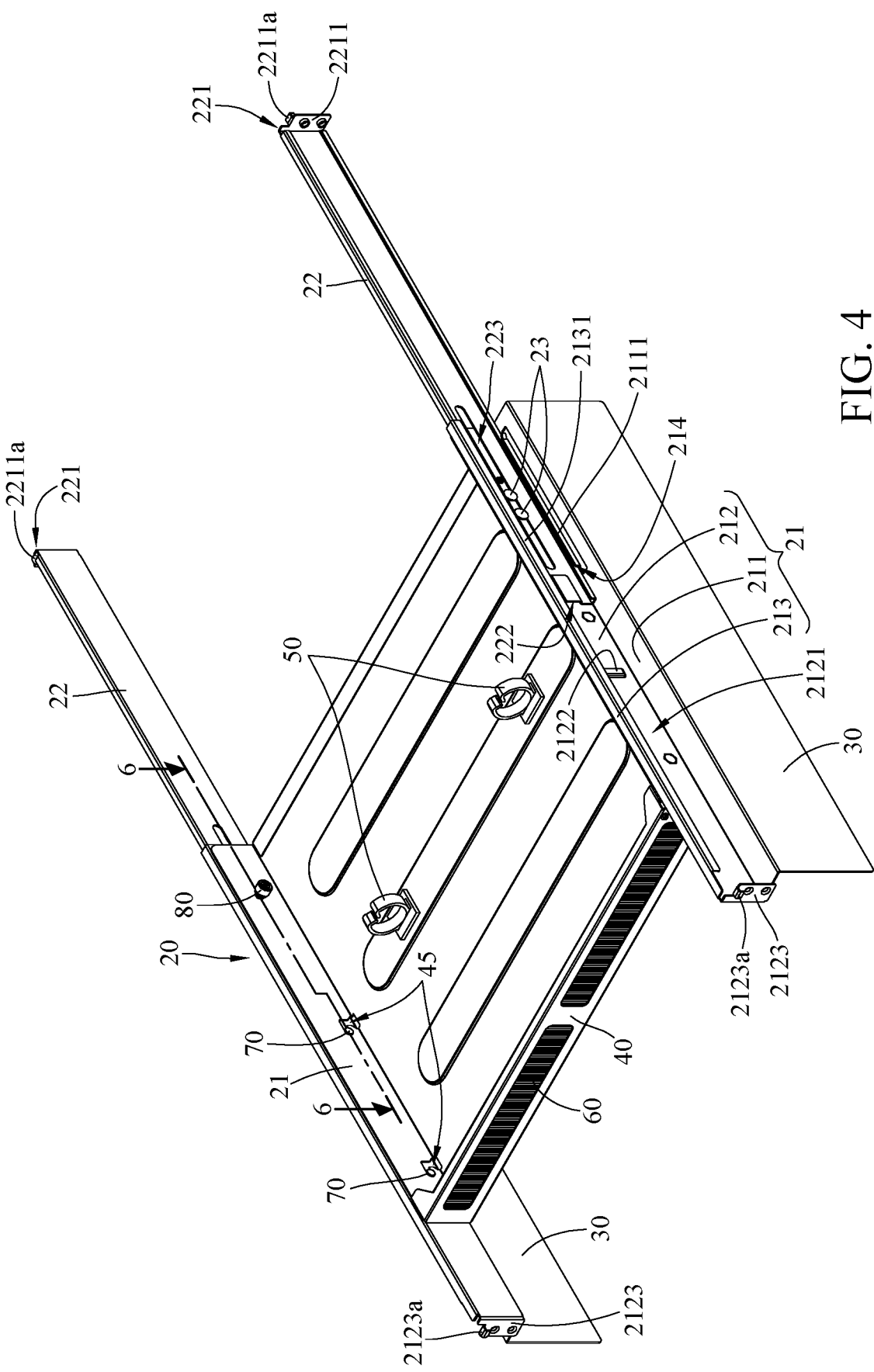
FIG. 4 is another perspective view of the stretchable frames, the baffles, and the tray of the server rack in FIG. 1.
Figure 5:
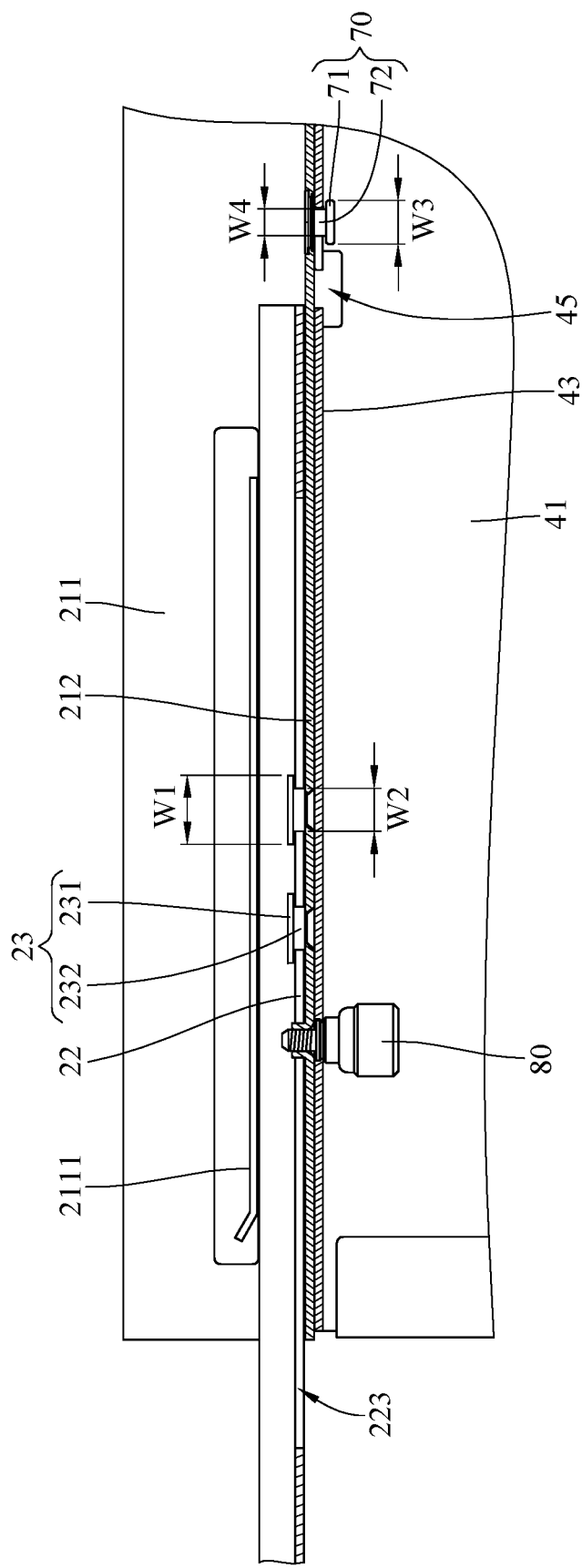
FIG. 5 is a partial cross-sectional view of the stretchable frames, the baffles, and the tray of the server rack in FIG. 3 taking along a cutting line 5-5.
Figure 6:
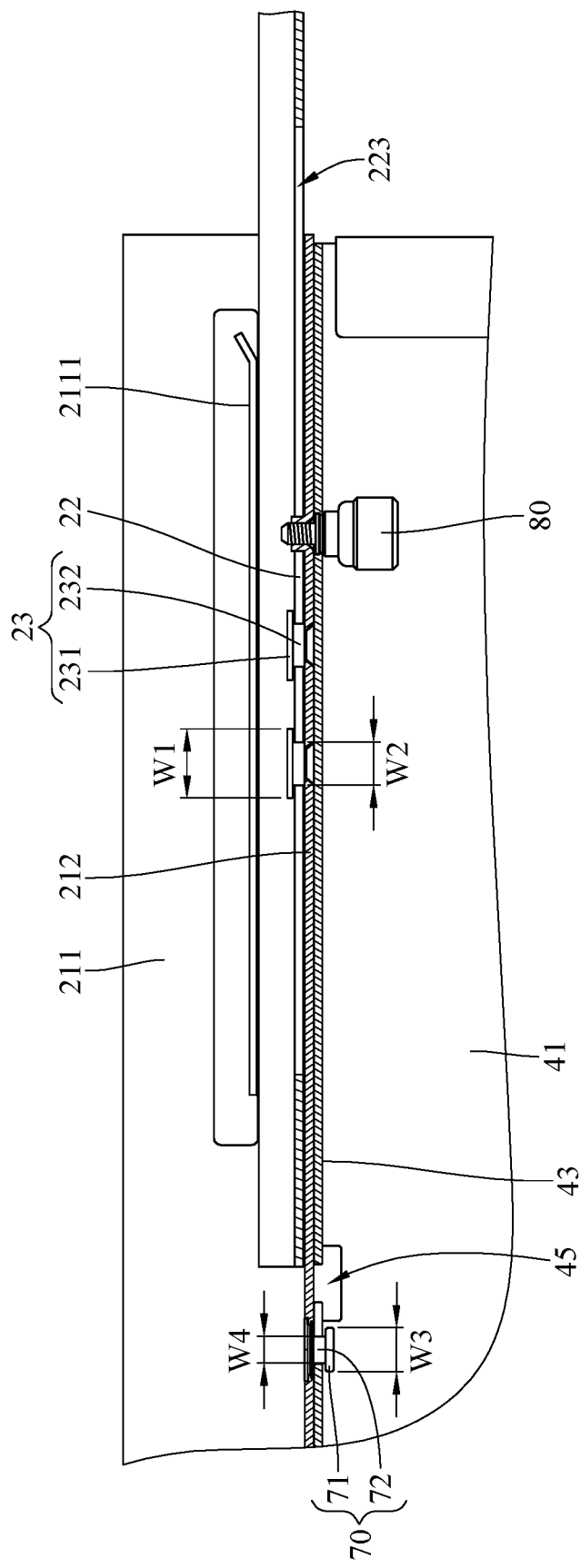
FIG. 6 is a partial cross-sectional view of the stretchable frames, the baffles, and the tray of the server rack in FIG. 4 taking along a cutting line 6-6.
Figure 7:
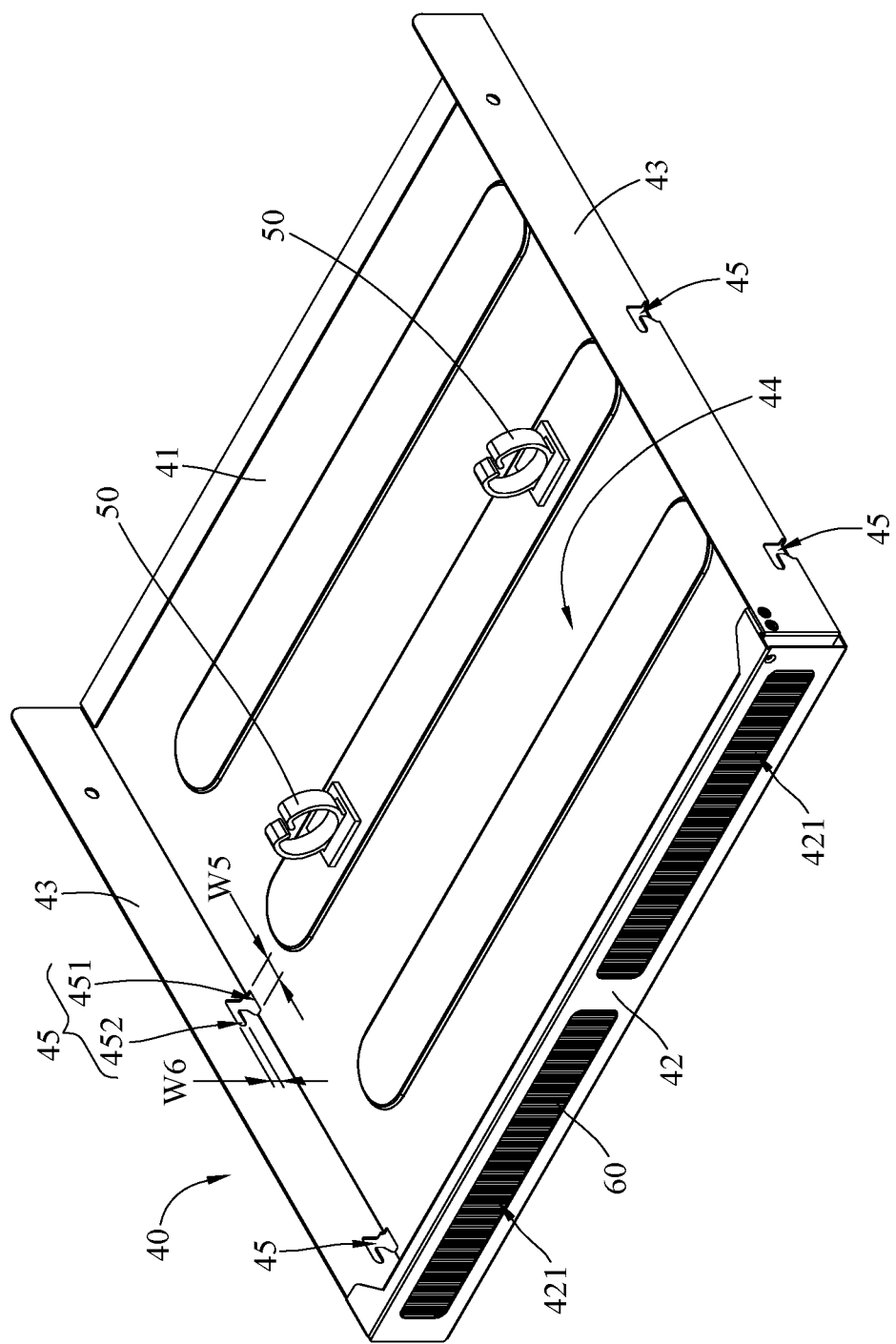
FIG. 7 is a perspective view of the tray of the server rack in FIG. 3.

Then, referring to FIGS. 3 to 6, there are shown a perspective view of stretchable frames 20, baffles 30, and a tray 40 of the server rack 1 in FIG. 1, another perspective view of the stretchable frames 20, the baffles 30, and the tray 40 of the server rack 1 in FIG. 1, a partial cross-sectional view of the stretchable frames 20, the baffles 30, and the tray 40 of the server rack 1 in FIG. 3 taking along a cutting line 5-5, and a partial cross-sectional view of the stretchable frames 20, the baffles 30, and the tray 40 of the server rack 1 in FIG. 4 taking along a cutting line 6-6.

The stretchable frames 20 are the same in structure, and thus the following paragraphs will only introduce one of them in detail.

The stretchable frame 20 includes a guiding part 21, an adjustable part 22, and two guide components 23. The guiding part 21 includes a first plate 211, a second plate 212, and a third plate 213. The first plate 211 and the third plate 213 are respectively connected to two opposite sides of a surface 2121 of the second plate 212. The first plate 211 has a tab portion 2111, and the third plate 213 has a tab portion 2131. The tab portions 2111 and 2131 and the surface 2121 of the second plate 212 together form a guide hole 214 therebetween. The adjustable part 22 is slidably disposed in the guide hole 214.

The adjustable part 22 has a first end portion 221 and a second end portion 222, and the second plate 212 has a stopper 2122. The first end portion 221 and the second end portion 222 of the adjustable part 22 are respectively located inside and outside of the guide hole 214, and the second end portion 222 of the adjustable part 22 is located between the stopper 2122 and the first end portion 221. The stopper 2122 is located at a side of the adjustable part 22 and thus limit the movement of the adjustable part 22 in one direction. The second plate 212 has a first tab structure 2123, and the first tab structure 2123 has a first hook part 2123a. The first end portion 221 of the adjustable part 22 has a second tab structure 2211, and the second tab structure 2211 has a second hook part 2211a. The first hook part 2123a of the first tab structure 2123 of the second plate 212 and the second hook part 2211a of the first end portion 221 of the adjustable part 22 are respectively hooked on the two first strips 11, and the first tab structure 2123 and the second tab structure 2211 are respectively fixed to the two first strips 11 via screwing.

Note that the installation manner of the first tab structure 2123 on the first strip 11 is not intended to limit the invention and may be modified; in some other embodiments, the first tab structure may be mounted on the first strip via the first hook part or screwing. Similarly, the second tab structure may be mounted on the first strip via the second hook part or screwing.

The adjustable part 22 further has a through hole 223. The guide components 23 each include a head portion 231 and a body portion 232 connected to each other. In one of the guide components 23, a width W1 of the head portion 231 is larger than a width W2 of the body portion 232. The body portions 232 of the guide components 23 are disposed through the through hole 223 and fixed to the second plate 212 of the guiding part 21, and the adjustable part 22 is located between the head portions 231 of the guide components 23 and the second plate 212. In this embodiment, since the body portions 232 of the guide components 23 are located in the through hole 223, the adjustable part 22 is prevented from being removed from the guiding part 21.

Note that the quantity of the guide components 23 of the stretchable frame 20 is not intended to limit the invention and may be modified; in some other embodiments, the stretchable frame may include only one guide component. In still another embodiment, the stretchable frame may not include any guide component, and the through hole of the adjustable part may be omitted.

Similarly, the guiding part 21 and the adjustable part 22 of the other one of the stretchable frames 20 are respectively mounted on the two second strips 12. Specifically, the first hook part 2123a of the first tab structure 2123 and the second hook part 2211a of the first end portion 221 of the adjustable part 22 are respectively hooked on the two second strips 12 and the first tab structure 2123 and the second tab structure 2211 are fixed on the second strips 12 via screwing.

One of the baffles 30 is connected to a side of the first plate 211 of one of the guiding parts 21 located away from its second plate 212, and is located between the two first strips 11. The other one of the baffles 30 is connected to a side of the first plate 211 of the other one of the guiding parts 21 located away from its second plate 212, and is located between the two second strips 12. A space formed between the baffles 30 are configured to accommodate the network switches 3; that is, the two baffles 30 are configured to be respectively located at two opposite sides of each network switch 3.

In this embodiment, the guiding part 21 and the adjustable part 22 of one of the stretchable frames 20 are respectively mounted on the two first strips 11 of the rack body 10, and the guiding part 21 and the adjustable part 22 of the other one of the stretchable frame 20 are respectively mounted on the two second strip 12 of the rack body 10. Thus, one of the baffle 30 is located between the two first strips 11 and located at a side of the network switch 3, and the other one of the baffle 30 is located between the two second strips 12 and located at another side of the network switch 3. Therefore, the baffles 30 can separate hot air generated by the network switches 3 from cold air F used to cool the network switches 3 and guide the cold air to the network switches 3, thereby effectively using the cold air F to cool the network switches 3.

On the other hand, the adjustable parts 22 of the stretchable frames 20 are respectively slidable relative to the guiding parts 21. Therefore, even though the distance between the two first strips 11 and the distance between the two second strips 12 have been adjusted, the stretchable frames 20 can respectively mate with the two first strips 11 and the two second strips 12, and the baffles 30 are allowed to be respectively located between the two first strips 11 and between the two second strips 12.

Referring to FIGS. 3 to 7, FIG. 7 is a perspective view of the tray 40 of the server rack in FIG. 3. The server rack 1 may further include the tray 40, a plurality of cable management components 50, a blocking component 60, and a plurality of fasteners 70.

The tray 40 includes a bottom plate 41, a front plate 42, and two side plates 43. The front plate 42 and the side plates 43 are respectively connected to different sides of the bottom plate 41, and the two side plates 43 are opposite to each other. The bottom plate 41, the front plate 42, and the side plates 43 together form an accommodation space 44 therebetween. The front plate 42 has two openings 421 connected to the accommodation space 44. The cable management components 50 are fixed on the bottom plate 41 and located in the accommodation space 44. The blocking component 60 is, for example, a brush. The blocking component 60 is fixed on the front plate 42, and different portions of the blocking component 60 are respectively located at the openings 421.

Note that the quantity of the openings 421 of the front plate 42 is not intended to limit the invention and may be modified; in some other embodiments, the front plate may have only one opening. On the other hand, the quantity of the blocking component is also not intended to limit the invention and may be modified; in some other embodiments, the server rack may include two blocking components, and the blocking components are respectively disposed at the openings of the front plate.

The fasteners 70 each include a head portion 71 and a body portion 72 connected to each other. The fasteners 70 are the same in structure, and therefore the following descriptions only introduce one of them in detail. A width W3 of the head portion 71 is larger than a width W4 of the body portion 72. Ends of the body portions 72 of the fasteners 70 respectively located away from the head portions 71 are connected to the second plates 212 of the guiding parts 21. In this embodiment, the tray 40 has a plurality of fastening holes 45. The fastening holes 45 are located at two opposite sides of the accommodation space 44. The fastening holes 45 are the same in structure, and therefore the following descriptions only introduce one of them in detail. The fastening hole 45 extends from the bottom plate 41 to the side plate 43. The fastening hole 45 has a wide portion 451 and a narrow portion 452 connected to each other. The wide portion 451 is located at the bottom plate 41, and the narrow portion 452 is located at the side plate 43. A width W5 of the wide portion 451 is larger than a width W3 of the head portion 71 of the fastener 70, and the width W3 of the head portion 71 of the fastener 70 is larger than a width W6 of the narrow portion 452.

Then, the following descriptions will introduce the installation of the tray 40 on the guiding parts 21. The first step is to respectively align the wide portions 451 of the fastening holes 45 of the tray 40 with the head portions 71 of the fasteners 70. The second step is to make the head portions 71 of the fasteners 70 respectively penetrate through the wide portions 451 of the fastening holes 45, such that the fasteners 70 respectively enter into the fastening holes 45. The third step is to move the tray 40 to allow one of the side plates 43 of the tray 40 to be located between the head portions 71 of some fasteners 70 and the second plate 212 of one of the guiding parts 21, allow the other one of the side plate 43 of the tray 40 to be located between the head portions 71 of the other fasteners 70 and the second plate 212 of the other one of the guiding parts 21, and allow the body portions 72 of the fasteners 70 to be respectively located in the narrow portions 452 of the fastening holes 45.

In this embodiment, the server rack 1 may further include a plurality of thumb screws 80. The thumb screws 80 are respectively disposed on the side plates of the tray 40. The thumb screws 80 are respectively screwed into the second plates 212 of the guiding parts 21.

Note that the tray 40 is not restricted to be fixed to the guiding part 21 via both of the cooperation between the fasteners 70 and the fastening holes 45 and the screwing manner; in some other embodiments, the tray may be fixed to the guiding part 21 via the cooperation between the fasteners 70 and the fastening holes 45 or the screwing manner; that is, the server rack may not include any fastener and the tray may not have any fastening hole, or the server rack may not include any thumb screw. In addition, the tray 40 is optional in the invention and may be omitted.

In this embodiment, the tray 40 is configured to be located between one of the servers 2 and one of the network switches 3. Cables (not shown) connecting with the server 2 and the network switch 3 penetrate through the openings 421 and the accommodation space 44 of the tray 40, and the cable management components 50 can manage these cables.

In this embodiment, since the blocking component 60 is a brush, the blocking component 60 not only allows the penetrations of the cables, but also prevents the cold air F from losing from the openings 421 of the tray 40. Therefore, the cold air F is ensured to flow towards the network switches 3.

Note that the quantities of the stretchable frames 20 and the baffles 30 are not intended to limit the invention and may be modified; in some other embodiments, the server rack may include only one stretchable frame and only one baffle, and both of them are disposed at a side of the network switch.

According to the server rack discussed in the above embodiments, the guiding part and the adjustable part of one of the stretchable frames are respectively mounted on the two first strips of the rack body, and the guiding part and the adjustable part of the other one of the stretchable frame are respectively mounted on the two second strips of the rack body. Thus, one of the baffles is located between the two first strips and located at a side of the network switch, and the other one of the baffles is located between the two second strips and located at another side of the network switch. Therefore, the baffles can separate hot air generated by the network switches from cold air used to cool the network switches and guide the cold air to the network switches, thereby effectively using the cold air to cool the network switches.

On the other hand, the adjustable parts of the stretchable frames are respectively slidable relative to the guiding parts. Therefore, even though the distance between the two first strips and the distance between the two second strips have been adjusted, the stretchable frames can be respectively mated with the two first strips and the two second strips, and the baffles are allowed to be respectively located between the two first strips and between the two second strips.

In addition, since the blocking component is a brush, the blocking component not only allows the penetrations of the cables, but also prevents the cold air from losing from the openings of the tray. Therefore, the cold air is ensured to flow towards the network switches.

Moreover, the cable management components can manage the cables in the tray.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A server rack, configured to accommodate a network switch, the server rack comprising:
   a rack body, having two first strips spaced apart from each other;
   at least one stretchable frame, comprising a guiding part and an adjustable part slidably disposed on the guiding part, wherein the guiding part and the adjustable part of the stretchable frame are respectively mounted on the two first strips; and
   at least one baffle, connected to the guiding part, wherein the at least one baffle is located between the two first strips, and the at least one baffle is configured to be located at a side of the network switch to guide an airflow to the network switch;
   wherein the guiding part comprises a first plate, a second plate, and a third plate, the first plate and the third plate are respectively connected to two opposite sides of a surface of the second plate, each of the first plate and the third plate has a tab portion, the tab portions and the surface of the second plate together form a guide hole therebetween, the adjustable part is slidably disposed in the guide hole, and the at least one baffle is connected to a side of the first plate located away from the second plate;
   wherein the at least one stretchable frame further comprises at least one guide component, the at least one guide component comprises a head portion and a body portion connected to each other, a width of the head portion is larger than a width of the body portion, the adjustable part has a through hole, the body portion is disposed through the through hole and fixed to the second plate, and the adjustable part is located between the head portion and the second plate.

2. The server rack according to claim 1, wherein the second plate has a stopper, the adjustable part has a first end portion and a second end portion opposite to each other, the first end portion is mounted on one of the two first strips, and the second end portion is located between the first end portion and the stopper.

3. The server rack according to claim 1, wherein the second plate has a first tab structure, the first tab structure has a first hook part, the adjustable part has a second tab structure, the second tab structure has a second hook part, and the first hook part and the second hook part are respectively hooked on the two first strips.

4. The server rack according to claim 3, wherein the first tab structure and the second tab structure are fixed to the two first strips via screwing.

5. The server rack according to claim 1, wherein the at least one stretchable frame comprises two stretchable frames, the at least one baffle comprises two baffles, the rack body further has two second strips opposite to the two first strips, the guiding part and the adjustable part of one of the two stretchable frames are respectively mounted on the two first strips, the guiding part and the adjustable part of another one of the two stretchable frames are respectively mounted on the two second strips, the two baffles are respectively connected to the two guiding parts, one of the baffles is located between the two first strips, another one of the two baffles is located between the two second strips, and the two baffles are configured to be respectively located at two opposite sides of the network switch to guide the airflow to the network switch.

6. The server rack according to claim 5, further comprising a tray, at least one blocking component, and at least one cable management component, wherein two opposite sides of the tray are respectively fixed to the guiding parts, the tray has an accommodation space and at least one opening connected to the accommodation space, the at least one blocking component is disposed at the at least one opening, and the at least one cable management component is disposed in the accommodation space of the tray.

7. The server rack according to claim 6, further comprising a plurality of thumb screws, wherein the plurality of thumb screws are respectively disposed on two opposite side plates of the tray, and the plurality of the thumb screws are respectively screwed into the guiding parts.

8. The server rack according to claim 6, further comprising two fasteners, wherein each of the fasteners comprises a head portion and a body portion connected to each other, widths of the head portions are larger than widths of the body portions, ends of the body portions respectively located away from the head portions are respectively connected to the guiding parts, the tray has two fastening holes, each of the fastening holes has a wide portion and a narrow portion connected to each other, widths of the wide portions are larger than the widths of the head portions, the widths of the head portions are larger than widths of the narrow portions, the body portions are respectively located in the narrow portions, and a part of the tray is located between one of the head portions and one of the guiding parts, and another part of the tray is located between another one of the head portions and another one of the guiding parts.

\* \* \* \* \*